US010580920B2

(12) United States Patent
Cooke et al.

(10) Patent No.: US 10,580,920 B2
(45) Date of Patent: Mar. 3, 2020

(54) SOLAR ANTENNA ARRAY FABRICATION

(71) Applicant: NovaSolix, Inc., Palo Alto, CA (US)

(72) Inventors: Laurence H. Cooke, Los Gatos, CA (US); Andreas Hegedus, Burlingame, CA (US); Jyotsna Iyer, Saratoga, CA (US); Paul Comita, Menlo Park, CA (US)

(73) Assignee: NovaSolix, Inc., Palo Alto, CA (US)

( * ) Notice: Subject to any disclaimer, the term of this patent is extended or adjusted under 35 U.S.C. 154(b) by 0 days.

(21) Appl. No.: 15/411,396

(22) Filed: Jan. 20, 2017

(65) Prior Publication Data

US 2017/0309766 A1 Oct. 26, 2017

Related U.S. Application Data

(63) Continuation-in-part of application No. 15/249,953, filed on Aug. 29, 2016, now abandoned, which is a
(Continued)

(51) Int. Cl.
*H01L 31/054* (2014.01)
*H02S 40/32* (2014.01)
(Continued)

(52) U.S. Cl.
CPC ........ *H01L 31/054* (2014.12); *H01L 31/0201* (2013.01); *H01L 31/028* (2013.01);
(Continued)

(58) Field of Classification Search
CPC ... H01L 31/0475; H01L 31/09; H01L 31/108; H01L 31/1085; H01L 31/0201;
(Continued)

(56) References Cited

U.S. PATENT DOCUMENTS

| 5,043,739 A | 8/1991 | Logan et al. |
| 7,354,877 B2 | 4/2008 | Rosenberger et al. |

(Continued)

FOREIGN PATENT DOCUMENTS

| CN | 102171811 A | 8/2011 | |
| FR | 2996681 A1 * | 4/2014 | ......... H01L 51/4206 |

(Continued)

OTHER PUBLICATIONS

Machine translation of FR2996681, Costel-Sorin. (Year: 2014).*
(Continued)

*Primary Examiner* — Mayla Gonzalez Ramos
(74) *Attorney, Agent, or Firm* — Panitch Schwarze Belisario & Nadel LLP

(57) ABSTRACT

A solar antenna array may comprise an array of carbon nanotube antennas that may capture and convert sunlight into electrical power. A method for constructing the solar antenna array from a glass top down to aluminum over a plastic bottom such that light passing through the glass top and/or reflected off the aluminum both may be captured by the antennas sandwiched between. Techniques for patterning the glass to further direct the light toward the antennas and techniques for continuous flow fabrication and testing are also described.

9 Claims, 18 Drawing Sheets

Related U.S. Application Data continuation-in-part of application No. 15/133,807, filed on Apr. 20, 2016, now abandoned.

(51) Int. Cl.

| | | |
|---|---|---|
| H01L 31/0224 | (2006.01) | |
| H01L 31/056 | (2014.01) | |
| H01L 31/0465 | (2014.01) | |
| H01L 31/06 | (2012.01) | |
| H01L 31/048 | (2014.01) | |
| H01L 31/028 | (2006.01) | |
| H01L 31/02 | (2006.01) | |
| H01L 31/0352 | (2006.01) | |

(52) U.S. Cl.
CPC ........... *H01L 31/022425* (2013.01); *H01L 31/035281* (2013.01); *H01L 31/048* (2013.01); *H01L 31/0465* (2014.12); *H01L 31/056* (2014.12); *H01L 31/0543* (2014.12); *H01L 31/0547* (2014.12); *H01L 31/06* (2013.01); *H02S 40/32* (2014.12); *Y02E 10/52* (2013.01); *Y02P 70/521* (2015.11)

(58) Field of Classification Search
CPC ........... H01L 31/022425; H01L 31/028; H01L 31/035281; H01L 31/0465; H01L 31/048; H01L 31/054; H01L 31/0543; H01L 31/0547; H01L 31/056; H01L 31/06; Y02E 10/52; H01Q 1/248; H02S 10/00; H02S 40/32; Y02P 70/521

See application file for complete search history.

(56) References Cited

U.S. PATENT DOCUMENTS

| | | |
|---|---|---|
| 7,354,977 B1 | 4/2008 | Woods et al. |
| 7,431,965 B2 | 10/2008 | Grigorian et al. |
| 7,431,985 B2 | 10/2008 | Iwama |
| 7,679,057 B2 | 3/2010 | Gritz et al. |
| 7,679,957 B2 | 3/2010 | Ma et al. |
| 7,687,160 B2 | 3/2010 | Winarski |
| 7,744,793 B2 | 6/2010 | Lemaire et al. |
| 8,137,653 B1 | 3/2012 | Predtechensky et al. |
| 2004/0085247 A1 | 5/2004 | Mickle et al. |
| 2005/0112049 A1 | 5/2005 | Hofmeister |
| 2005/0214198 A1 | 9/2005 | Park et al. |
| 2007/0240757 A1 | 10/2007 | Ren et al. |
| 2009/0128893 A1 | 5/2009 | McCarthy et al. |
| 2010/0084475 A1 | 4/2010 | Hata et al. |
| 2010/0244656 A1* | 9/2010 | Ito .................. H01Q 1/2283 313/358 |
| 2010/0263709 A1* | 10/2010 | Norman ............... F24J 2/07 136/246 |
| 2010/0284086 A1 | 11/2010 | Novack et al. |
| 2011/0121258 A1 | 5/2011 | Hanein et al. |
| 2011/0163920 A1 | 7/2011 | Cutler |
| 2012/0186635 A1 | 7/2012 | Eastman et al. |
| 2012/0206085 A1 | 8/2012 | Stevens |
| 2012/0211063 A1 | 8/2012 | Lee et al. |
| 2013/0249771 A1* | 9/2013 | Kotter ............... H01Q 1/248 343/893 |
| 2013/0276861 A1* | 10/2013 | Cooke ............... H01L 31/09 136/246 |
| 2015/0130692 A1 | 5/2015 | Cooke |
| 2015/0155396 A1 | 6/2015 | Cooke et al. |
| 2015/0243817 A1 | 8/2015 | Cooke et al. |
| 2016/0027949 A1 | 1/2016 | Cooke et al. |

FOREIGN PATENT DOCUMENTS

| | | |
|---|---|---|
| FR | 2996681 A1 | 4/2014 |
| TW | 201110272 A | 3/2011 |
| WO | 2007120175 A2 | 10/2007 |
| WO | 2014063149 A1 | 4/2014 |

OTHER PUBLICATIONS

Collinear—Definition and More from the Free Merriam-Webster Dictionary, "http://www.merriam-webster.com/dictionary/collinear", 2014.
Rows—Definition and More from the Free Merriam-Webster Dictionary, "http://www.merriam-webster.com/dictionary/rows," 2014.
Siciliano et al., "Nano-Rectenna for High Efficiency Direct Conversion of Sunlight to Electricity," presented at 17th World Micromachine Summit, Apr. 26-29, 2011.
Williams, "Rice's carbon nanotube fibers outperform copper," at "http://news.rice.edu/2014/02/13/rices-carbon-nanotube-fibers-outperform-copper-2," posted Feb. 13, 2014.
Hata, "From Super Growth to DWNT forests, CNT solids, Flexible Transparent CNT films, and Super-Capacitors and Much More," Jun. 19, 2006.
Ma et al., "The production of horizontally aligned single-walled carbon nanotubes," Carbon, 49, pp. 4098-4110, 2011.
Kumar, "Chemical Vapor Deposition of Carbon Nanotubes: A Review on Growth Mechanism and Mass Production," Journal of Nanoscience and Nanotechnology, vol. 10, pp. 3739-3758, 2010.
Office Action dated Feb. 11, 2014 in U.S. Appl. No. 13/454,155.
Office Action dated Jun. 27, 2014 in U.S. Appl. No. 13/454,155.
Office Action dated Sep. 26, 2014 in U.S. Appl. No. 13/454,155.
Office Action dated Jan. 13, 2015 in U.S. Appl. No. 13/454,155.
Type—definition of type by the Free Dictionary, downloaded from web page: http://www.thefreedictionary.com/type, Download date: Mar. 9, 2015, original posting date: unknown, 1 page.
Office Action dated Mar. 17, 2015 in U.S. Appl. No. 13/454,155.
Int'l Search Report and Written Opinion dated Apr. 8, 2016 in Int'l Application No. PCT/US15/59852.
Int'l Search Report and Written Opinion dated Aug. 11, 2016 in Int'l Application No. PCT/US16/29336.
Office Action dated Nov. 14, 2016 in U.S. Appl. No. 14/582,747, by Cooke.
Office Action dated Dec. 29, 2016 in U.S. Appl. No. 15/133,807, by Cooke et al.
Office Action dated Apr. 5, 2017 in U.S. Appl. No. 14/582,747 by Cooke.
Int'l Search Report and Written Opinion dated Jun. 20, 2017 in Int'l Application No. PCT/US2017/026130.
Office Action dated Jun. 8, 2017 in U.S. Appl. No. 14/701,765, by Cooke.
Office Action dated May 4, 2017 in U.S. Appl. No. 15/249,953, by Cooke.
Office Action dated Apr. 20, 2017 in U.S. Appl. No. 14/871,958, by Cooke.
Office Action dated Mar. 7, 2017 in U.S. Appl. No. 14/701,765, by Cooke.
Office Action dated Sep. 22, 2017 in U.S. Appl. No. 13/454,155, by Cooke.
Int'l Preliminary Report dated Jul. 6, 2017 in PCT Application No. PCT/US2015/059852.
Office Action dated Jul. 3, 2017 in U.S. Appl. No. 15/133,807, by Cooke.
Office Action dated Mar. 9, 2018 in U.S. Appl. No. 15/133,807, by Cooke.
Extended European Search Report dated Sep. 7, 2018 in EP Application No. 15873906.0.
Extended European Search Report dated Oct. 15, 2018 in EP Application No. 16789760.2.
Office Action dated Sep. 18, 2018 in CN Application No. 201680025443.3.
Office Action dated May 31, 2019 in U.S. Appl. No. 15/661,854.

(56) References Cited

OTHER PUBLICATIONS

Int'l Preliminary Report on Patentability dated Nov. 16, 2017 in Int'l Application No. PCT/US2016/029336.
Office Action dated Jan. 11, 2018 in U.S. Appl. No. 15/249,953, by Cooke.
Office Action dated May 5, 2019 in CN Application No. 201580071231.4.
Office Action dated May 29, 2018 in CN Application No. 201580071231.4.
Search Report dated Jul. 8, 2019 in TW Application No. 104137565.

* cited by examiner

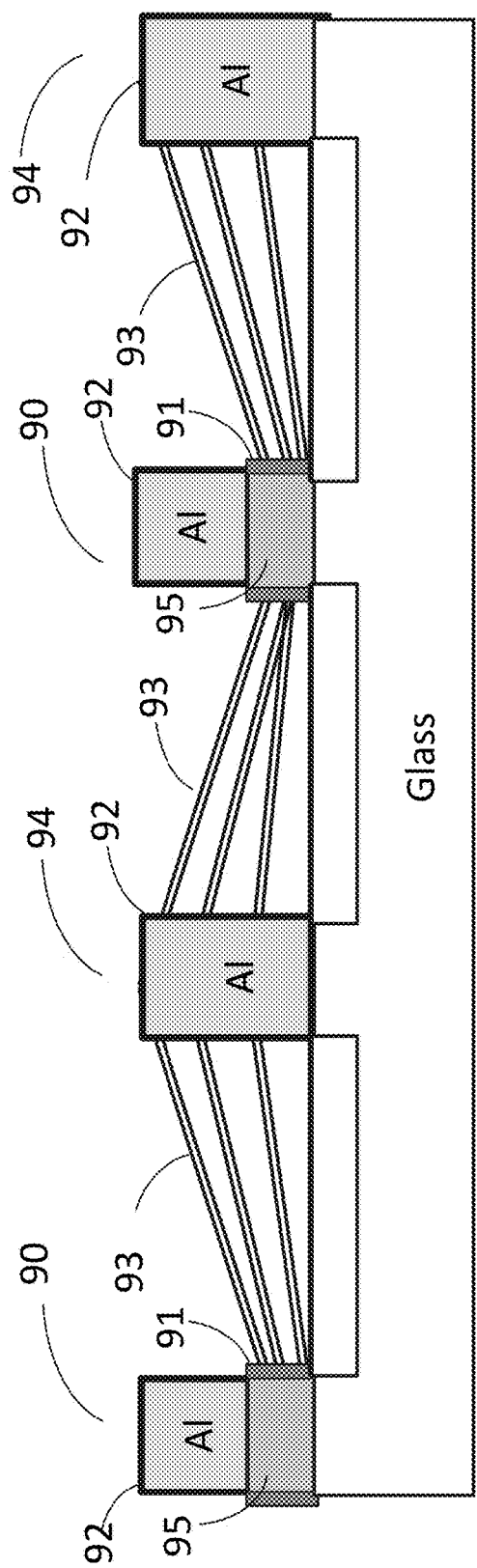
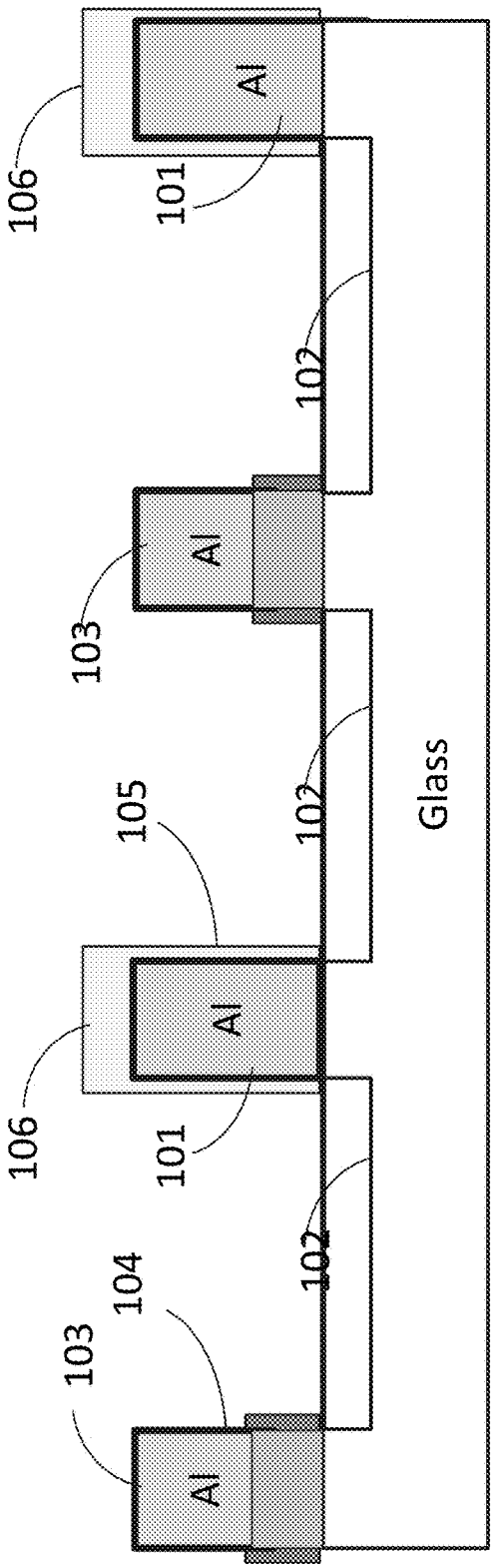
FIG. 9
FIG. 10

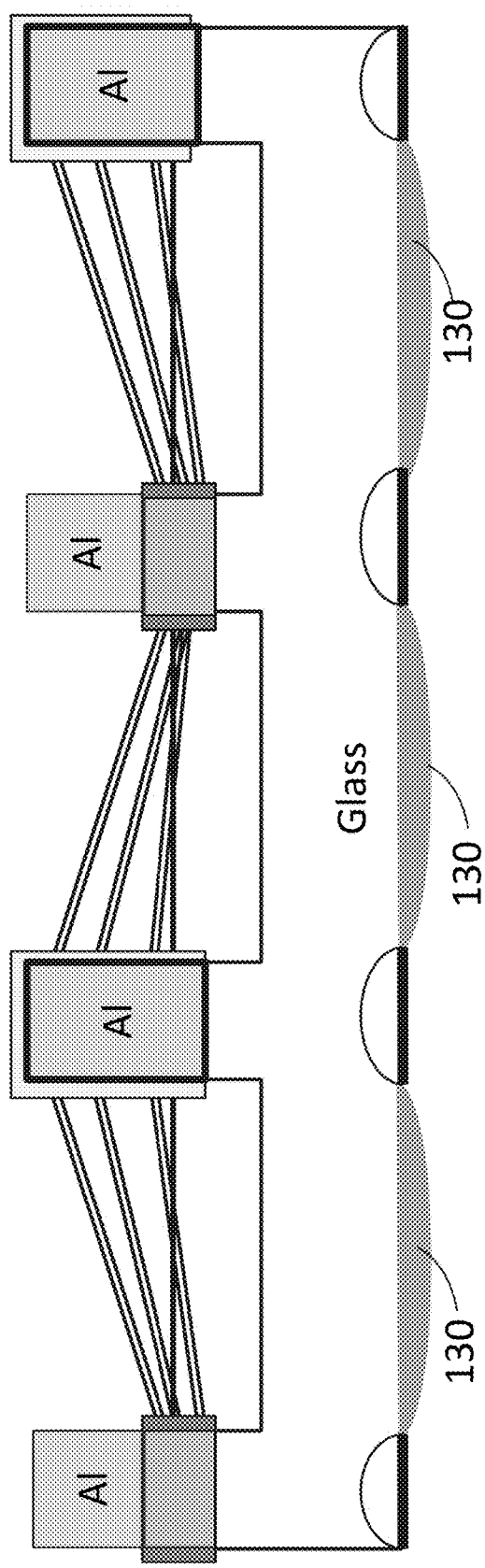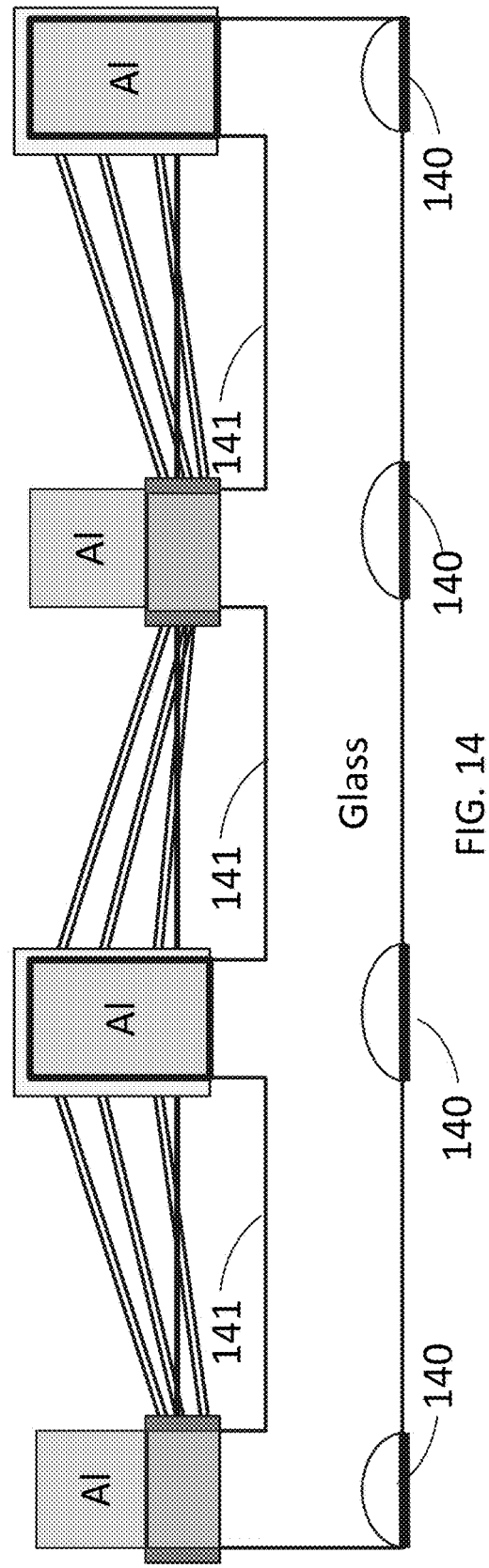

SOLAR ANTENNA ARRAY FABRICATION

CROSS-REFERENCE TO RELATED APPLICATIONS

This application is a continuation-in-part of U.S. patent application Ser. No. 15/249,953, filed on Aug. 29, 2016, which is a continuation-in-part of U.S. patent application Ser. No. 15/133,807, filed on Apr. 20, 2016, which are both incorporated herein by reference.

FIELD OF ENDEAVOR

Various aspects of this disclosure may pertain to economical manufacturing processes of visible light rectenna arrays for the conversion of solar energy to electricity.

BACKGROUND

Rectifiers for AC to DC conversion of high frequency signals have been well known for decades. A particular type of diode rectifier when coupled to an antenna, called a rectenna, has also been known for decades. More specifically, over 20 years ago, Logan described using an array of rectennas to capture and convert microwaves into electrical energy in U.S. Pat. No. 5,043,739 granted Aug. 27, 1991. However, the dimensions of the antenna limited the frequency until recently, when Gritz, in U.S. Pat. No. 7,679,957 granted Mar. 16, 2010, described using a similar structure for converting infrared light into electricity, and Pietro Siciliano suggested that such a structure may be used for sunlight in "Nano-Rectenna For High Efficiency Direct Conversion of Sunlight to Electricity," by Pietro Siciliano of The Institute for Microelectronics and Microsystems IMM-CNR, Lecce (Italy).

Still, the minimum dimensions required for such visible light rectennas are generally in the tens of nanometers. While these dimensions may be accomplished by today's deep submicron masking technology, such processing is typically far more expensive than the current solar cell processes, which require much larger dimensions.

Still, as Logan pointed out in U.S. Pat. No. 5,043,739, the efficiency of microwave rectennas can be as high as 40%, more than double that of typical single junction poly-silicon solar cell arrays, and when using metal-oxide-metal (MOM) rectifying diodes, as Pietro suggests, no semiconductor transistors are needed in the array core.

As such, it may be advantageous to be able to utilize the existing fine geometry processing capability of current semiconductor fabrication without incurring the cost of such manufacturing.

Also, recently, Rice University reported that their researchers created a carbon nanotube (CNT) thread with metallic-like electrical and thermal properties. Furthermore, carbon nanotube structures are becoming more manufacturable, as described by Rosenberger et al. in U.S. Pat. No. 7,354,977 granted Apr. 8, 2008. Various forms of continuous CNT growth may have also been contemplated, such as Lemaire et. al. repeatedly harvesting a CNT "forest" while it is growing in U.S. Pat. No. 7,744,793 granted Jun. 29, 2010, and/or put into practice using techniques described by Predtechensky et al. in U.S. Pat. No. 8,137,653 granted Mar. 20, 2012. Grigorian et al. describes continuously pushing a carbon gas through a catalyst backed porous membrane to grow CNTs in U.S. Pat. No. 7,431,985 granted Oct. 7, 2008.

Furthermore, others have contemplated using CNTs for various structures such as Rice University's CNT thread as described in "Rice's carbon nanotube fibers outperform copper," by Mike Williams, posted on Feb. 13, 2014 at: news.rice.edu/2014/02/13/rices-carbon-nanotube-fibers-outperform-copper-2; magnetic data storage as described by Tyson Winarski in U.S. Pat. No. 7,687,160 granted Mar. 30, 2010; and in particular, antenna-based solar cells, as described by Tadashi Ito et al. in US Patent Publication 2010/0244656 published Sep. 30, 2010. Still, Ito et al. did not describe methods to inexpensively construct carbon nanotube solar antennas for efficient conversion of solar energy.

SUMMARY OF VARIOUS EMBODIMENTS

Various aspects of the present disclosure may relate to ways to manufacture structures of CNT rectenna arrays for converting sunlight into electricity, which may utilize stamps made using current IC manufacturing techniques and self-aligning process steps, and which may be used to achieve the dimensions required for the antennas.

The structure of the rectenna array may include an array of CNT antennas connecting a ground plane to a negative voltage plane through geometric diodes, or metal insulator insulator carbon (MIIC) diodes. The antennas may be of varying lengths and orientations, distributed for maximum reception of the full spectrum of ambient sunlight, e.g., having ¼ wavelengths or harmonic multiples of ¼ wavelengths. Single ¼-wavelength antenna diode combinations may half-wave rectify the received light. Two coupled ¼-wavelength antenna diode combinations may full-wave rectify the received light.

In one aspect, the rectenna arrays may be constructed by a series of depositions from a glass base up to a plastic back such that the antennas collect light through the glass base. Aluminum bus bars may further reflect the received or retransmitted light to be re-collected by the antennas. In one such deposition, nickel oxide may be deposited, stamped and etched. Later the nickel oxide may be reduced and annealed to form a layer of nickel catalyst for growing the CNT antennas. In another aspect another oxide may be deposited, stamped and etched. Later the nickel may be further deposited and annealed to form the layer of nickel catalyst for growing the CNT antennas.

In another aspect, stamps may be constructed to pattern metals for selectively etching the structures necessary to create the CNT antenna array. Alternatively, the stamps may be used to directly pattern metal, or may be further used to pattern drums for high volume continuous CNT antenna array manufacturing.

In yet another aspect, oxide may be grown or deposited and subsequently reduced, or a shadow mask may be used to selectively etch a deposited oxide. Furthermore, a clear plastic sheet may separate metal bus bars from the CNT antennas. A laser may be used to form vias in the plastic sheet. The plastic sheet may be a polycarbonate sheet. A cover layer of plastic may be deposited on the bus bars, thereby forming a continuous roll of flexible solar cells.

BRIEF DESCRIPTION OF THE DRAWINGS

Various aspects of the present disclosure will now be described in connection with the attached drawings, in which:

FIG. 7 through FIG. 15 are cross sections of an antenna array during successive steps of manufacture according to one or more aspects of the present disclosure.

DESCRIPTION OF VARIOUS ASPECTS OF THE PRESENT DISCLOSURE

Various aspects of the present disclosure are now described with reference to FIG. 1 through FIG. 22, it being appreciated that the figures may illustrate the subject matter of various aspects and may not be to scale or to measure.

Figure 2:
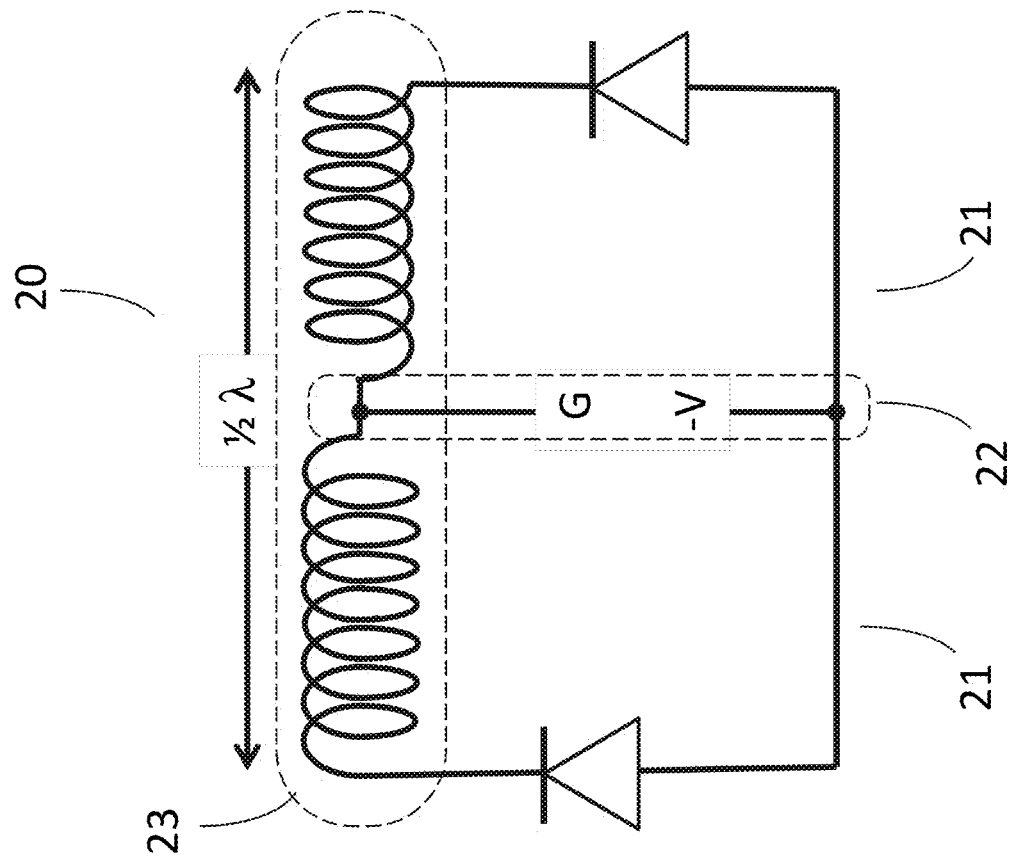
FIG. 2 is another electrical diagram of a pair of diodes and antennas according to an aspect of the present disclosure.
Figure 1:
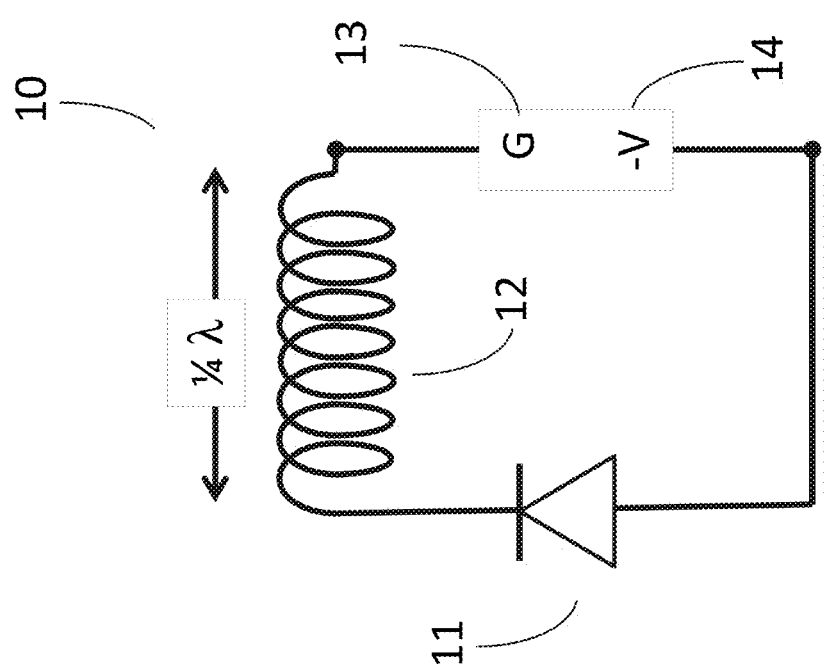
FIG. 1 is an electrical diagram of a combined diode and antenna according to an aspect of the present disclosure.

An electrical diagram 10 of a combined diode and antenna according to an aspect of the present disclosure is shown in FIG. 1. A diode 11 and a ¼-wavelength antenna 12 may be coupled together, with the antenna 12 further connected to a ground line 13 and the diode 11 connected to a negative voltage (−V) line 14, to form a ½-wave rectified structure. Another electrical diagram 20 of a pair of diodes and antennas according to another aspect of the present disclosure, is shown in FIG. 2. Two structures 21, each equivalent to the electrical diagram shown in FIG. 1, may be coupled to common ground and −V lines 22, to form a full-wave rectified structure.

Figure 3:
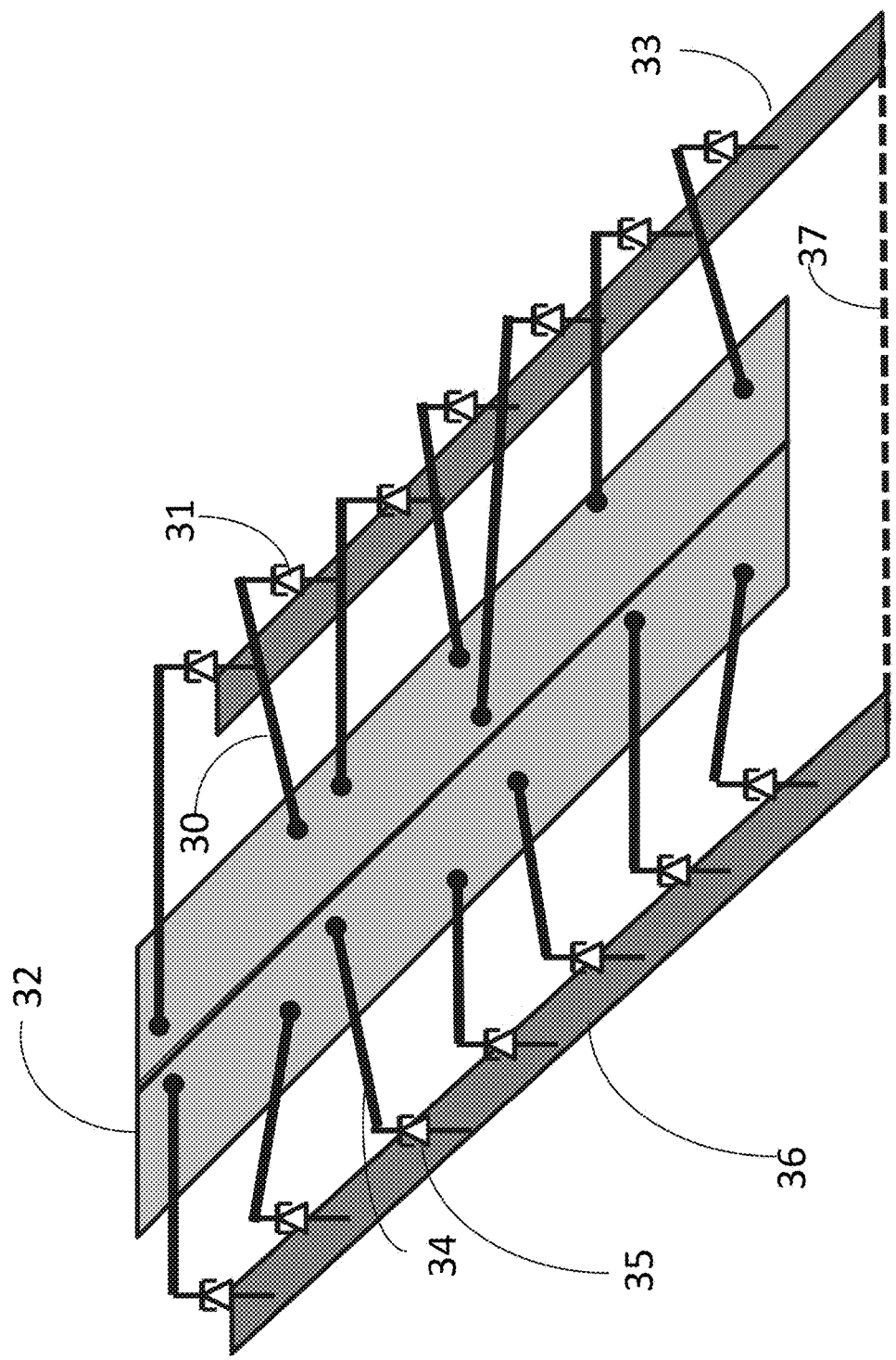
FIG. 3 is a logical diagram of an array of antennas and diodes according to an aspect of the present disclosure.

Reference is now made to FIG. 3, a conceptual diagram of an array of antennas and diodes according to an aspect of the present disclosure. The antenna 30 and diode 31 may be respectively connected to the ground plane 32 and the power plane 33 in a manner similar to the electrical diagram in FIG. 1. A second antenna 34 and diode 35 may be respectively connected to another side of the ground plane 32 and another power plane 36, which may in turn be connected 37 to the original power plane. Together, the antennas 30,34 and diodes 31,35 may be connected to the power 33,36 and ground 32 planes in a manner similar to the electrical diagram in FIG. 2. The antennas may be of varying lengths and may be randomly placed between the diodes and the ground plane 32. The antennas may be metallic carbon nanotubes.

Figure 4:
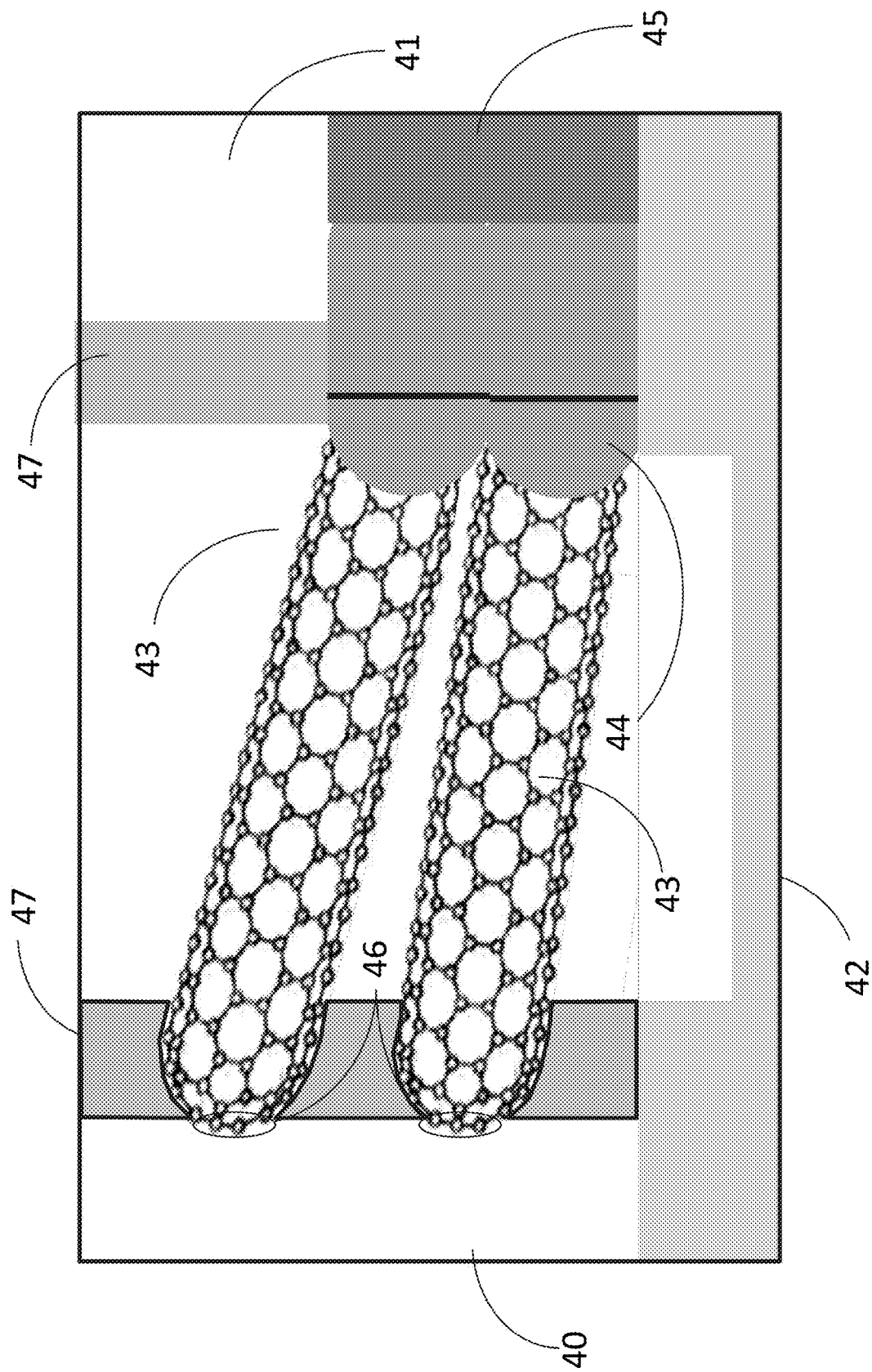
FIG. 4 and FIG. 5 are diagrams of cross-sections of an antenna array depicting multiple diode and carbon nanotube antennas according to aspects of the present disclosure.

Reference is now made to FIG. 4, a diagram of a cross-section of an antenna array, depicting multiple diodes and CNT antennas according to an aspect of the present disclosure. The antennas 43 may be either single-walled metallic carbon nanotubes, or multi-walled carbon nanotubes, which may be attached to the ground plane 41 via a catalyst 44. The catalyst may be used to grow the CNTs. The catalyst maybe composed of nickel, iron, cobalt, or some other suitable metal or alloy of metals. The catalyst may be a thin vertical layer formed by reducing and annealing an oxide of the catalyst 45. The oxide of the catalyst 45 may be sufficiently thick enough to form multiple sites for carbon nanotubes. The vertical sites may aid in growing adequate densities of carbon nanotube antennas. The tips 46 of the carbon nanotubes 43 may extend beyond the oxide layer 47, forming a direct contact between the carbon nanotube 43 and the metal 40. This structure may form a geometric diode coupling the carbon nanotube antennas 43 to the voltage plane 40. The power and ground planes may be insulated from each other via a base 42. The base 42 may be, for example, a ceramic, glass or a plastic material. The power 40 and ground 41 planes may be composed of one or more metals.

Figure 5:
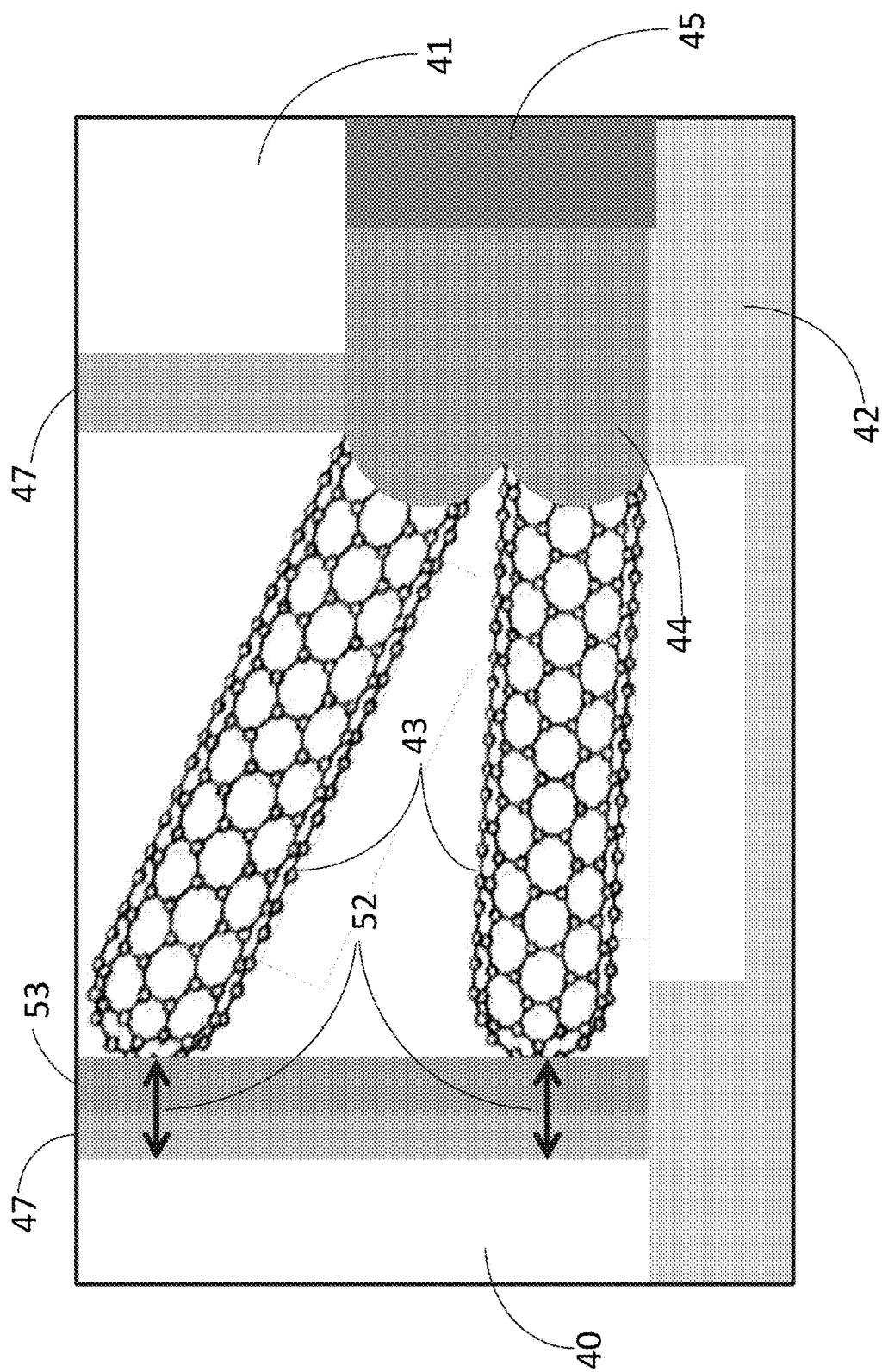

Reference is now made to FIG. 5, another diagram of a cross-section of an antenna array depicting multiple diodes and CNT antennas according to another aspect of the present disclosure. In this case a different oxide layer 53 may cover the original oxide layer 47 to form metal-insulator-insulator-carbon (MIIC) diodes 52 between the CNTs 43 and the power plane 40.

In order to efficiently rectify visible light, the diodes may need to have a cutoff frequency above 700 THz. This may require diodes (46 or 52) with sufficiently small capacitance, which may be accomplished by growing CNTs under 15 nanometers in diameter to oxides that are each a few nanometers thick. In addition, the small diameter of the CNT connecting to the large flat side of the power plane may enhance the geometric diode. Furthermore, the antennas' lengths and directions may vary to cover substantially the entire spectrum of un-polarized sunlight. This may be accomplished by varying the distance the carbon nanotubes 43 must cover from the ground 41 plane to the power plane 40, such that the difference of the shortest to the longest carbon nanotube may be greater than the difference between a ¼ wavelength of ultraviolet light (~80 nanometers) and ¼ wavelength of infrared light (~640 nanometers). This may ensure that at least one harmonic of substantially all frequencies of sunlight may be covered by the range of CNT lengths.

Such small structures may require the combination of complex semiconductor processing coordinated with controlled growth of carbon nanotube antennas. It may, therefore, be desirable to leverage as much of existing semiconductor processing as possible, and to incrementally modify the process to reduce cost and increase volume. As such, an initial manufacturing process may rely on existing semiconductor mask and etching operations, and may gradually change to a continuous flow of maskless operations.

Figure 6:
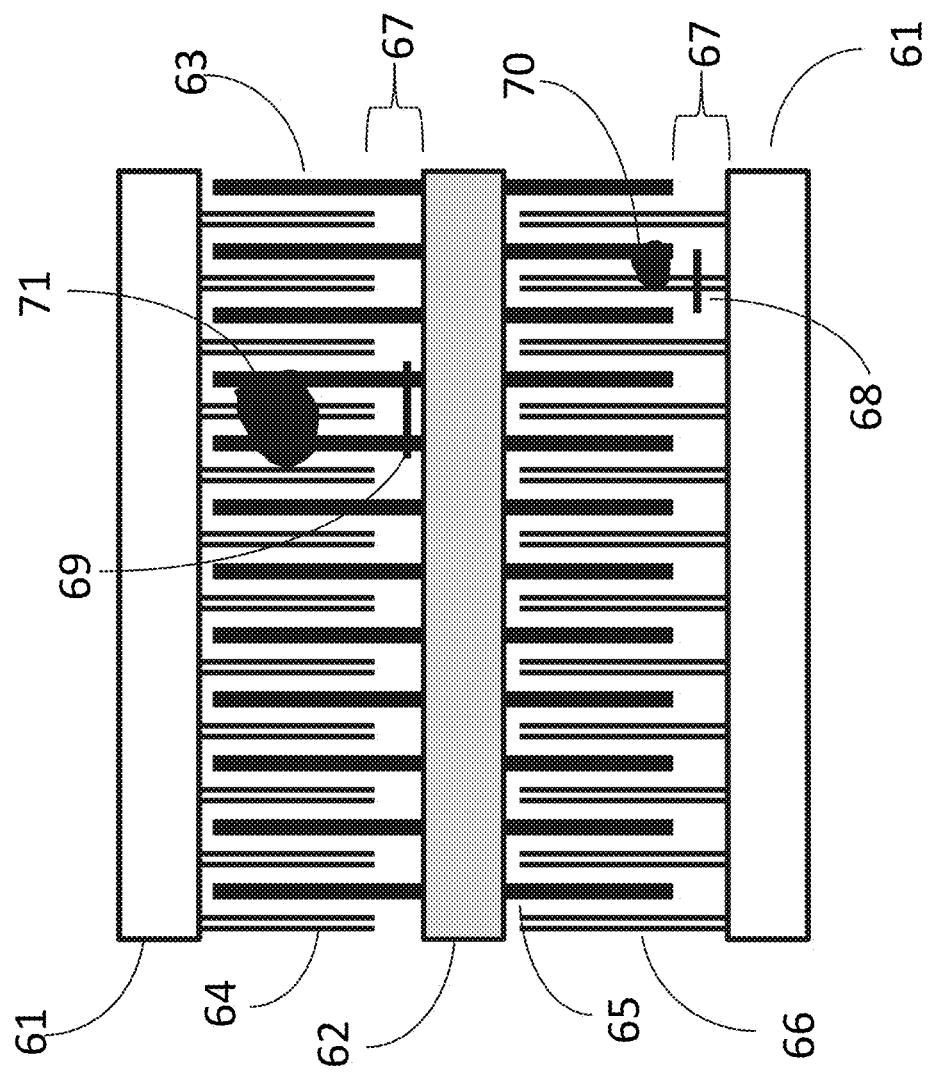
FIG. 6 is a diagram of top view of a section of an array of antennas according to an aspect of the present disclosure.
Figure 7:
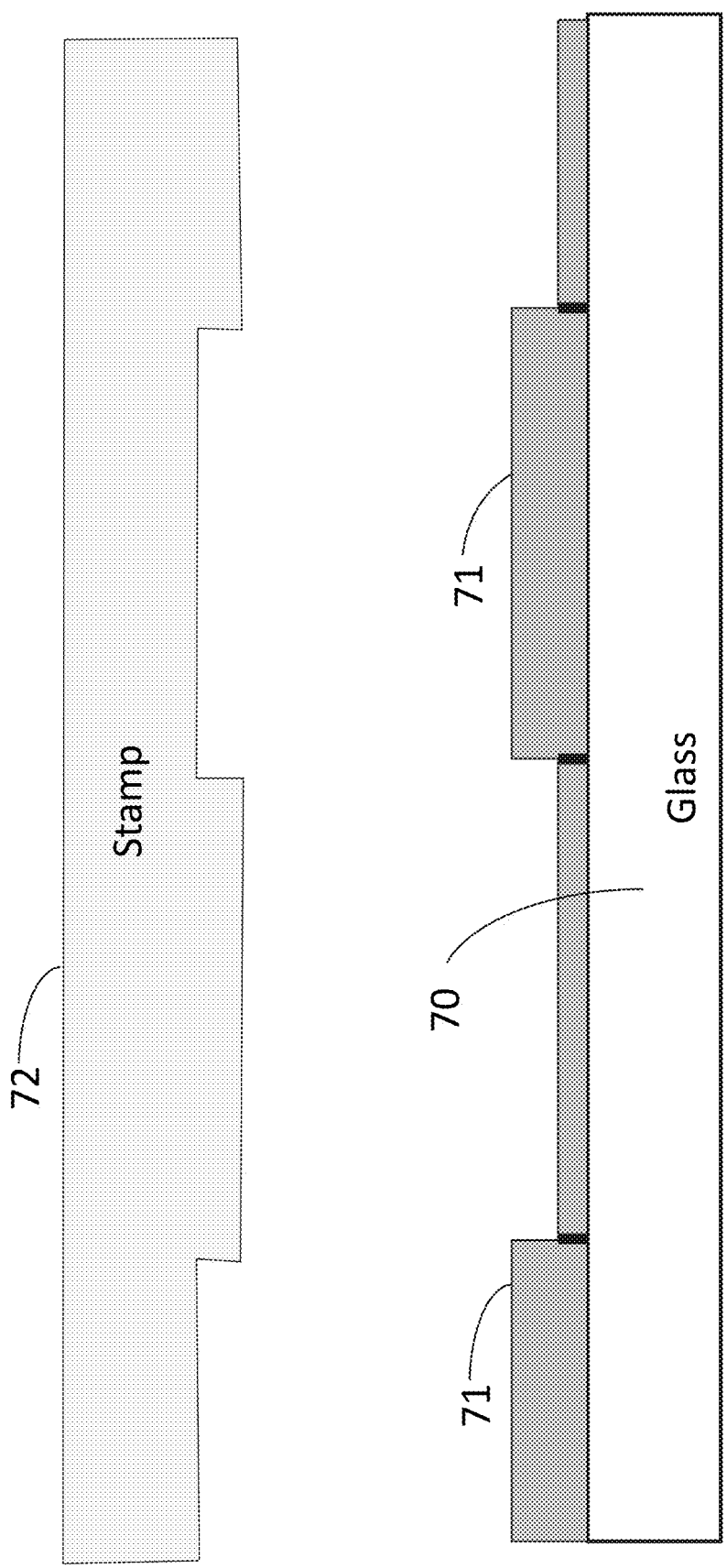
Figure 8:
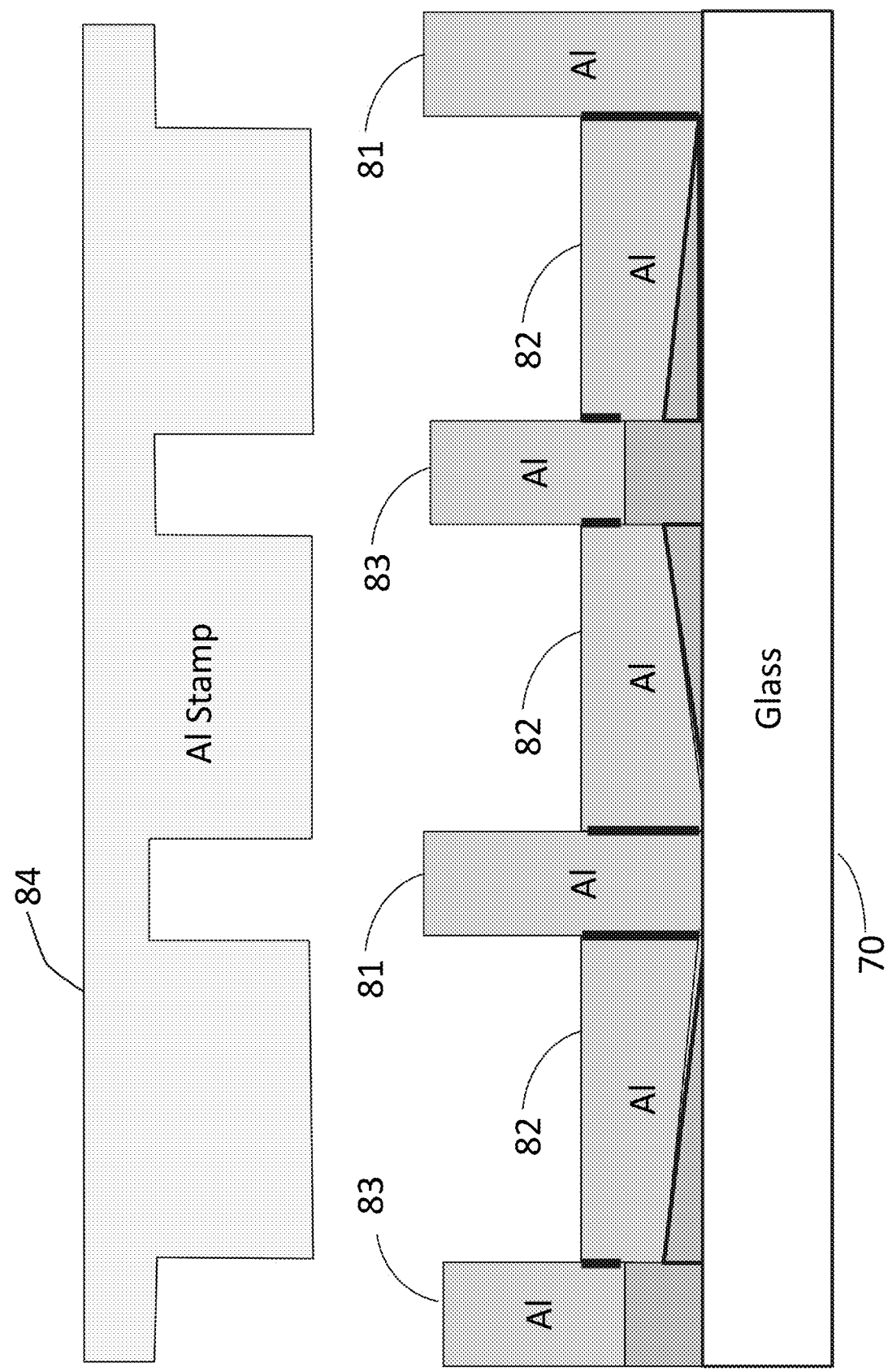
Figure 11:
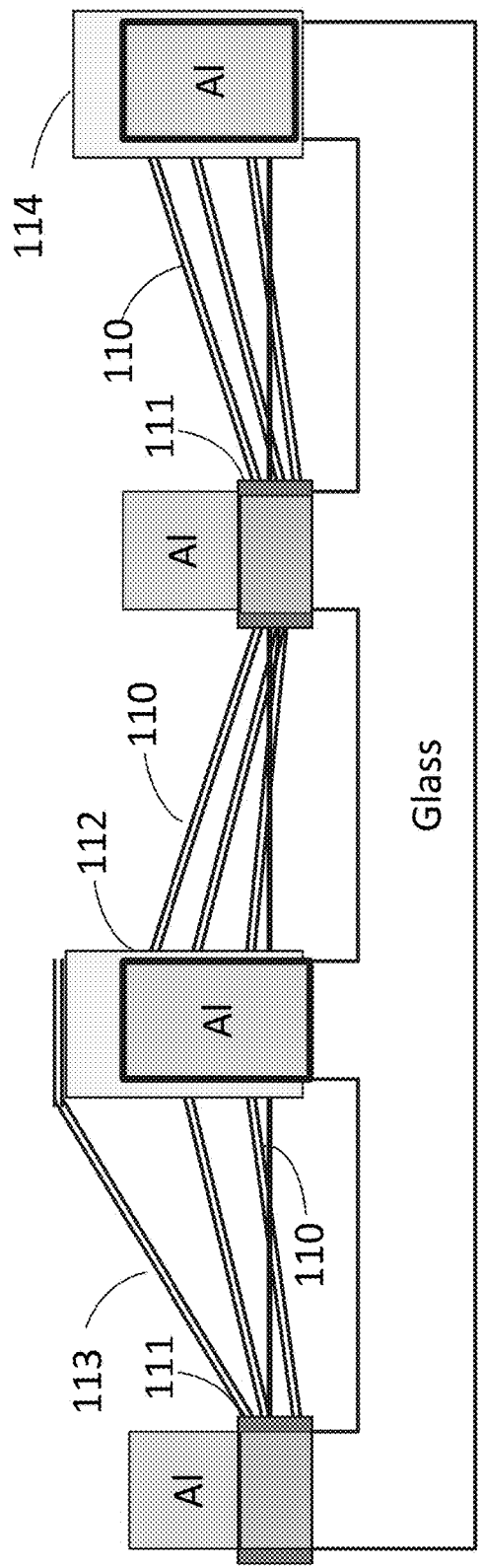
Figure 12:
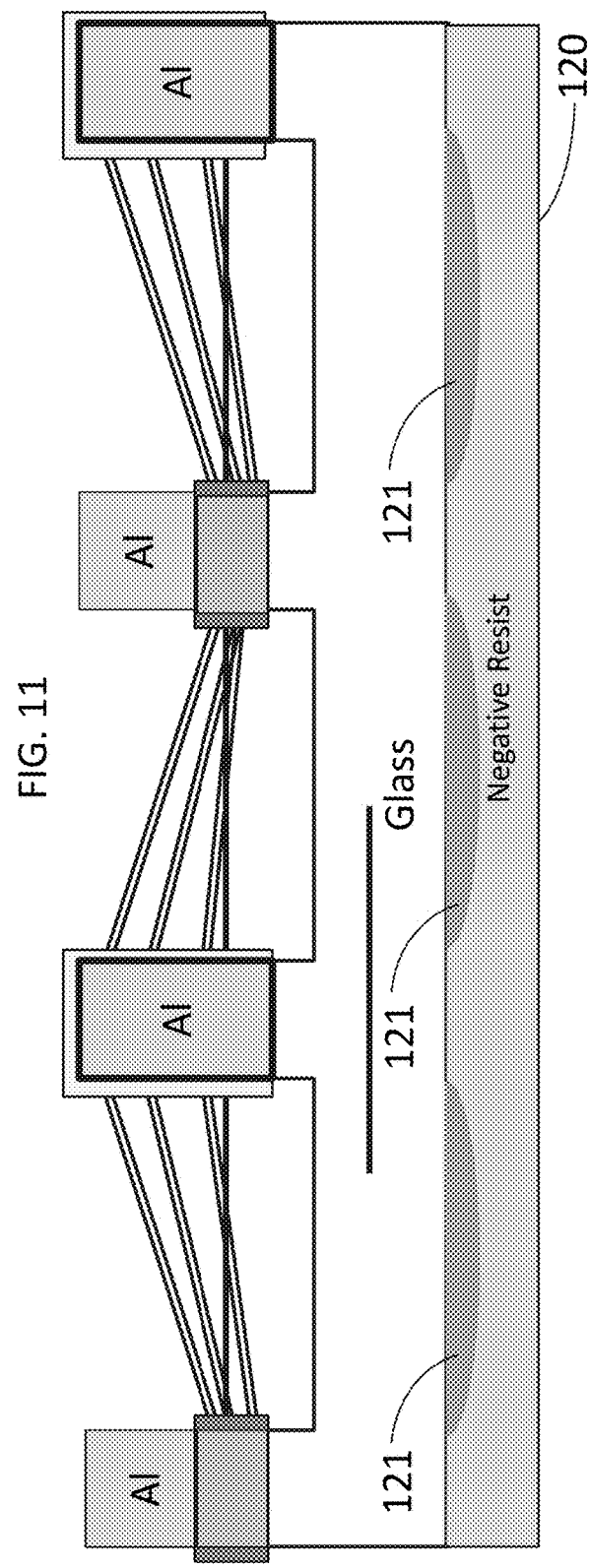
Figure 15:
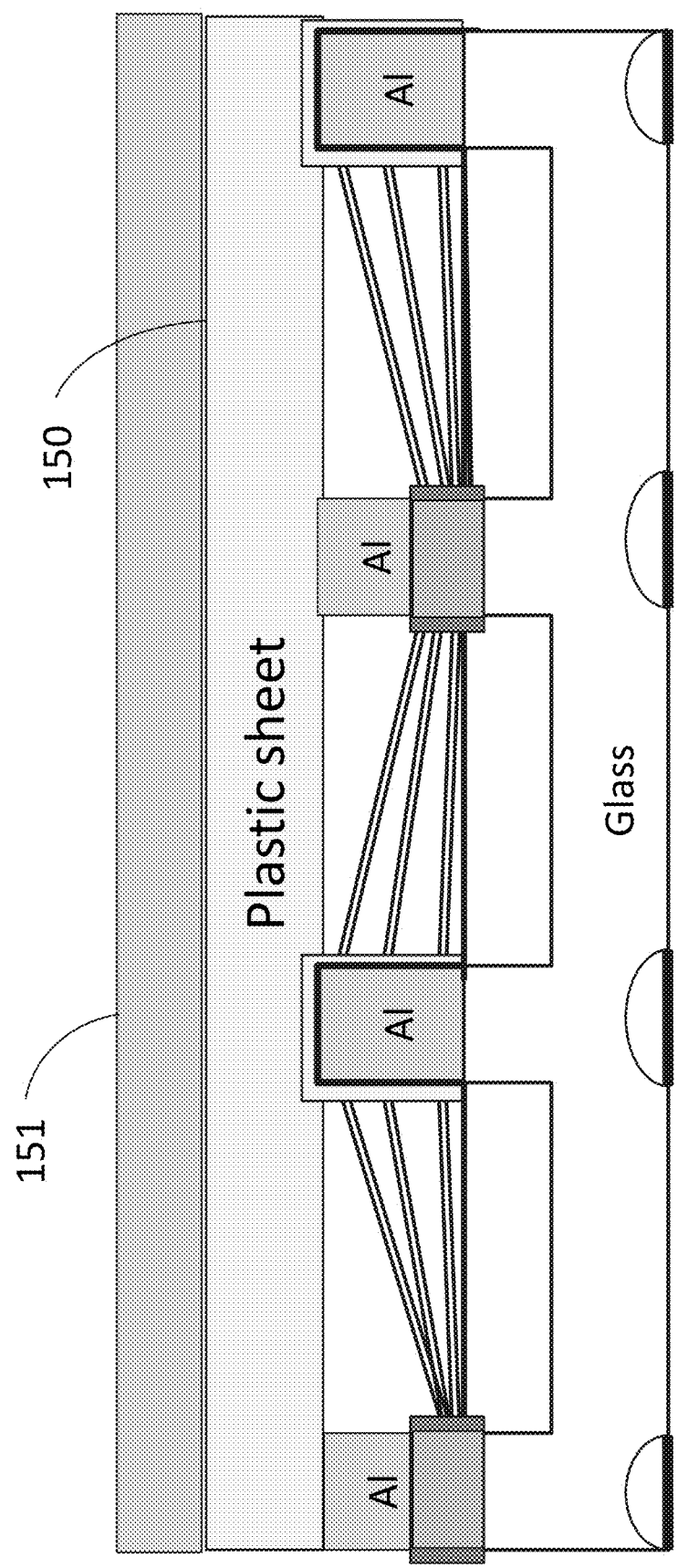

Reference is now made to FIG. 6, a diagram of a top view of a section of an array of antennas according to an aspect of the present disclosure. This structure may include large power 61 and ground 62 bus lines, with interleaved smaller power 64 and ground 63 fingers, with the CNT antennas spanning between adjacent power 66 and ground 67 fingers. For the CNTs grown between the fingers to vary up to a ½ micron, the space between the fingers may be at least a micron, and to maximize the CNT light absorption area, the fingers may be as narrow as may be economically manufactured.

Semiconductor masking technology may typically consist of steppers and contact printers. Typically, steppers can print very fine geometries, such as the fingers above, but can only expose a small part of the die at a time. On the other hand, contact printers may expose the whole wafer at one time, but can only align and print very large objects. In order to construct a wafer-wide array of the structure shown in FIG.

6, it may be necessary to step a die pattern, which may overlap bus lines 61 and 62 at the top and bottom of the die pattern. Contact printing connecting the bus bar ends may then be done first, followed by the stepper printing of the dies. A wider gap 67 between the end of the power fingers 64 and the ground bus line 62 and between the end of the ground fingers 63 and the power bus line 61 may be sufficiently large enough to allow laser cutting one finger 68 or multiple fingers 69 shorted by defects 70 and 71, and as a method to self-align the resist 160 shown in FIG. 16, which may separate the Cu—Al bus bars 170 shown in FIG. 17.

Reference is now made to FIG. 7 through FIG. 15, cross-sections of an antenna array during successive steps in manufacture according to an aspect of the present disclosure. Initially, a glass or quartz wafer may be used, and may later be replaced with rolls of glass. Normal liftoff masking may then be used to deposit a thin layer of nickel oxide 71. Alternatively, a physical vapor deposition (PVD) process may deposit a layer of material on the substrate 70, which may then be stamped either by a single wafer stamp 72 in a manner not dissimilar to pressing a DVD, or by a drum, which may continuously press ~1 micron stripes 71 in the deposited material. The deposited material may be nickel oxide or an alloy of nickel and another metal, such as aluminum. Optionally, a thin adhesion layer, such as nickel or titanium, may be deposited before depositing the nickel oxide or nickel alloy. Subsequently, the nickel oxide or nickel alloy may be vertically etched until the stripes have been separated. Measuring the resistance between the stripes and/or the light between the stripes may be used to control this etch process. Thereafter, a thicker layer of aluminum or other suitable metal may be deposited on the glass, and may be patterned with a stamp 84 to form thicker power fingers 81 and/or ground fingers 83 and thinner spaces 82 on the glass substrate 70. An etch may then remove a sufficient amount of material to separate the ground fingers 90 and power fingers 94 and may create depressions in the glass 102 between them. These processes may be done in different sections of one high-vacuum chamber. Measuring the resistance between the power and ground lines may be used to control this metal finger etch process.

A "pump up" may then be performed to process the rest of the vacuum steps in a low vacuum. Thereafter, an isotropic etch and anneal may be applied to the nickel alloy 95 to form a thin layer of nickel 91, or an anneal may be performed to create a vertical nickel layer 91 on the nickel oxide 95, or a deposition of nickel 91 may be performed on another oxide such as silicon oxide 95. The anneal may be a combination of a reduction step using hydrogen or ammonia to convert the nickel oxide 95 into a layer of nickel 91, and a rapid thermal anneal (RTA) to convert the nickel layer into suitable nickel balls for carbon nanotube growth.

The carbon nanotube growth may be performed by applying an electrical field between the the ground fingers 90 and the power fingers 94. Furthermore the current may be clamped and monitored to minimize the disconnection of the carbon nanotubes 93, which may bridge the gap between the ground fingers 90 and the power fingers 94.

To manufacture the geometric diodes, the carbon nanotubes 93 may be grown to aluminum 92 on the power fingers 94, which may not have aluminum oxide 104 on them, followed by growing oxide 92 over all the fingers, which may grow around the tips of the carbon nanotubes 46 as shown in FIG. 4.

For the MIIC diodes, a first oxide 104 may be grown or deposited on the aluminum fingers 101 followed by a deposition of a second oxide 105. The second oxide may be much thicker on the tops of the fingers 106 than the sides 105. Using a plasma etch and applying an electrical bias between the power and ground lines, a selective etch may be performed to remove the oxides from the ground fingers 103. Carbon nanotube antennas 110 may subsequently be grown from the nickel catalyst 111 to the double oxide diodes 112. While the power fingers 81 and ground fingers 83 may be stamped tall enough to minimize the number of carbon nanotubes that grow above the fingers, some carbon nanotubes 113 may grow over the top of the thicker oxide 114, which may not form antenna diode combinations because of the thick oxide.

Subsequent to the carbon nanotube growth, a negative resist may be sprayed onto the bottom glass surface 120 and exposed 121 from above through the glass. After washing the unexposed resist away, the exposed resist 130 may remain, protecting the glass. Etching the bottom of the glass may create lenses 140 that may disperse the light towards the trenches 141. Thereafter, a plastic sheet 150 may be attached on top of the fingers, covering the whole glass, and resist 151 may be sprayed on the plastic sheet. The plastic sheet may be a polycarbonate sheet.

Figure 16:
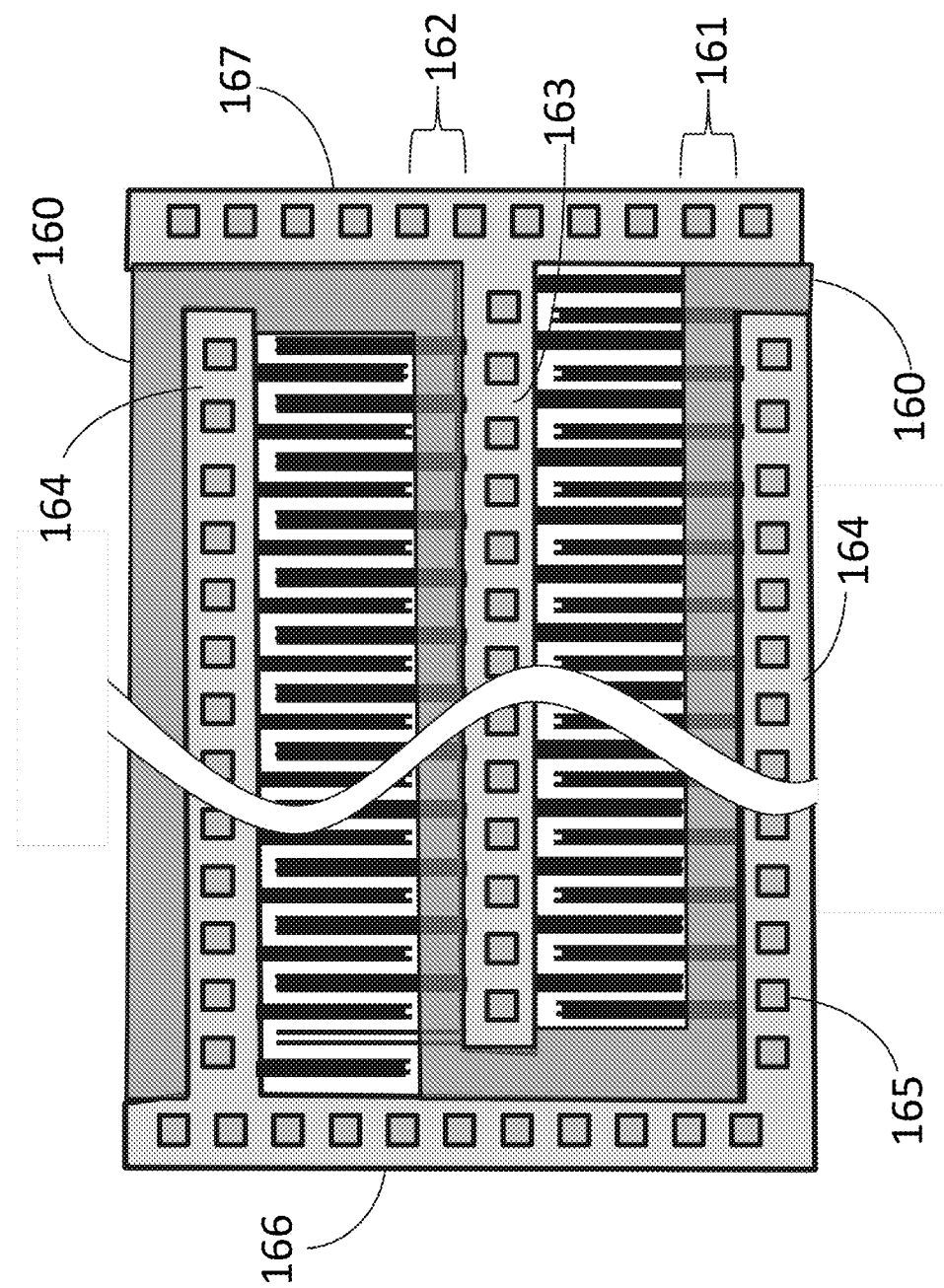
FIG. 16 is a top view of the vias and bus bars during steps of their construction, according to an aspect of the present disclosure.

Reference is now made to FIG. 16, a top view of the vias and bus bars during steps of their construction, according to an aspect of the present disclosure. At the sides of the glass plate or roll, vertical bus lines 166,167 may be formed by the edge of the aluminum stamp. Additionally, intermediate vertical bus lines may also be formed periodically along the glass plate or roll. The bus lines may have been adjusted at their ends to connect the ground bus lines 163 to the right vertical bus line 167 and the power bus lines 164 to the left vertical bus line 166.

A polarizing grate may transmit light whose wavelength may be larger than the grate's spacing, when the light may be polarized perpendicular to the grate, and may reflect light of the same wavelength, which may be parallel to the direction of the lines in the grate. By shining vertically polarized light up through the glass and plastic sheet, which may have a longer wavelength than the spacing between the fingers, resist over the gaps 162 and 163 and the ends of the rows of fingers between the vertical bus lines 166 and 167 and the bus lines 163, may be exposed. Alternatively, non-polarized light may be used, which may be partially absorbed by the carbon nanotube antennas when the left and right vertical bus lines 166 and 167 may be electrically connected through a resistor which may remove some of the light shining through the solar cell, leaving all the light to transmit through the area not connected with carbon nanotube antennas, thereby exposing the resist 160. Washing away the unexposed resist may leave the resist 160, which may then be cured, forming a continuous serpentine separation between the power 164 and ground 163 bus lines. Laser scribing may then be used to form vias 165 through the plastic sheet. Optionally, an additional spray may be applied before laser scribing to enhance the scribing of the vias.

Figure 17:
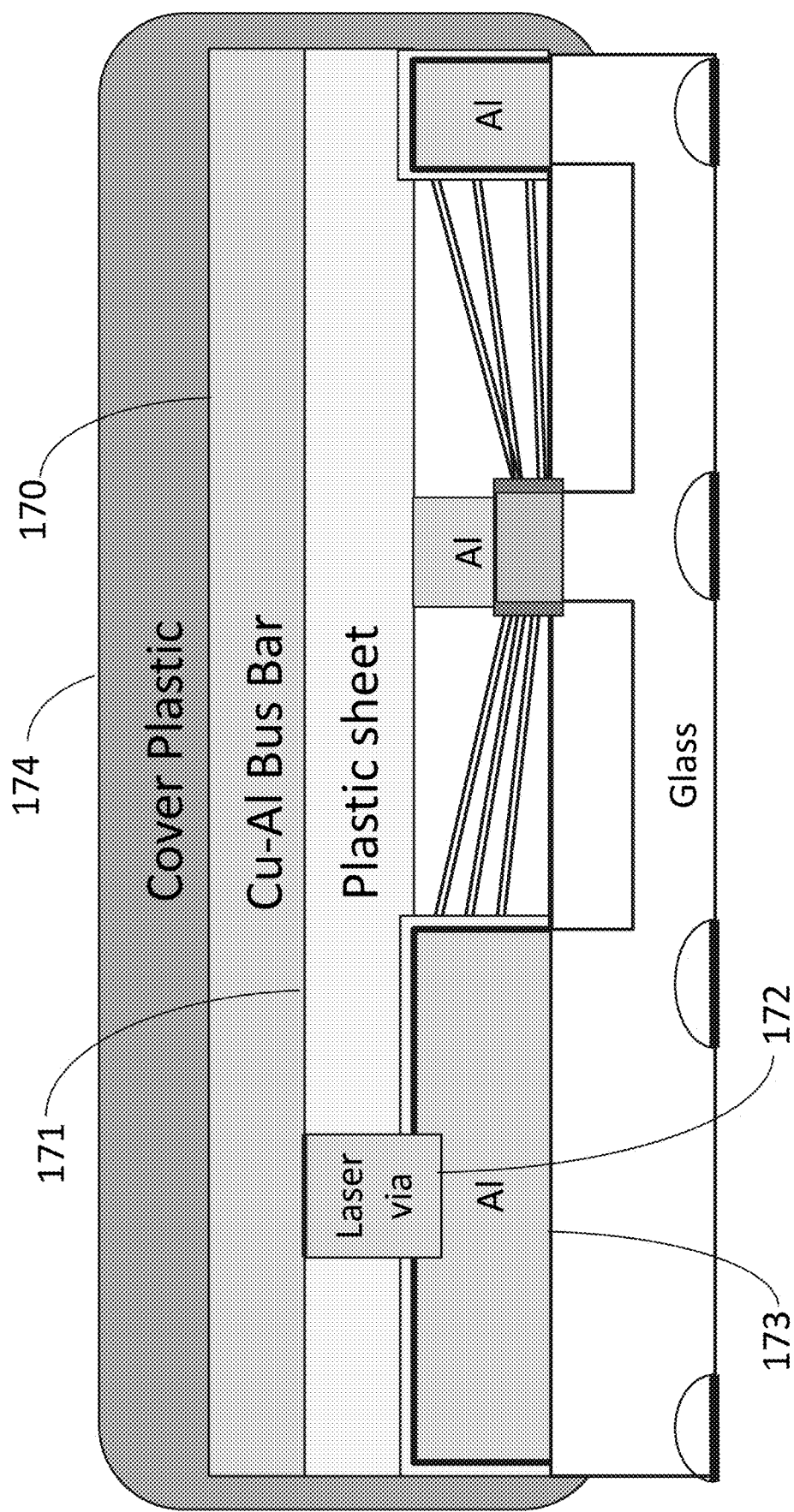
FIG. 17 and FIG. 18 are cross-sections of an antenna array during the final steps of manufacturing according to an aspect of the present disclosure.
Figure 18:
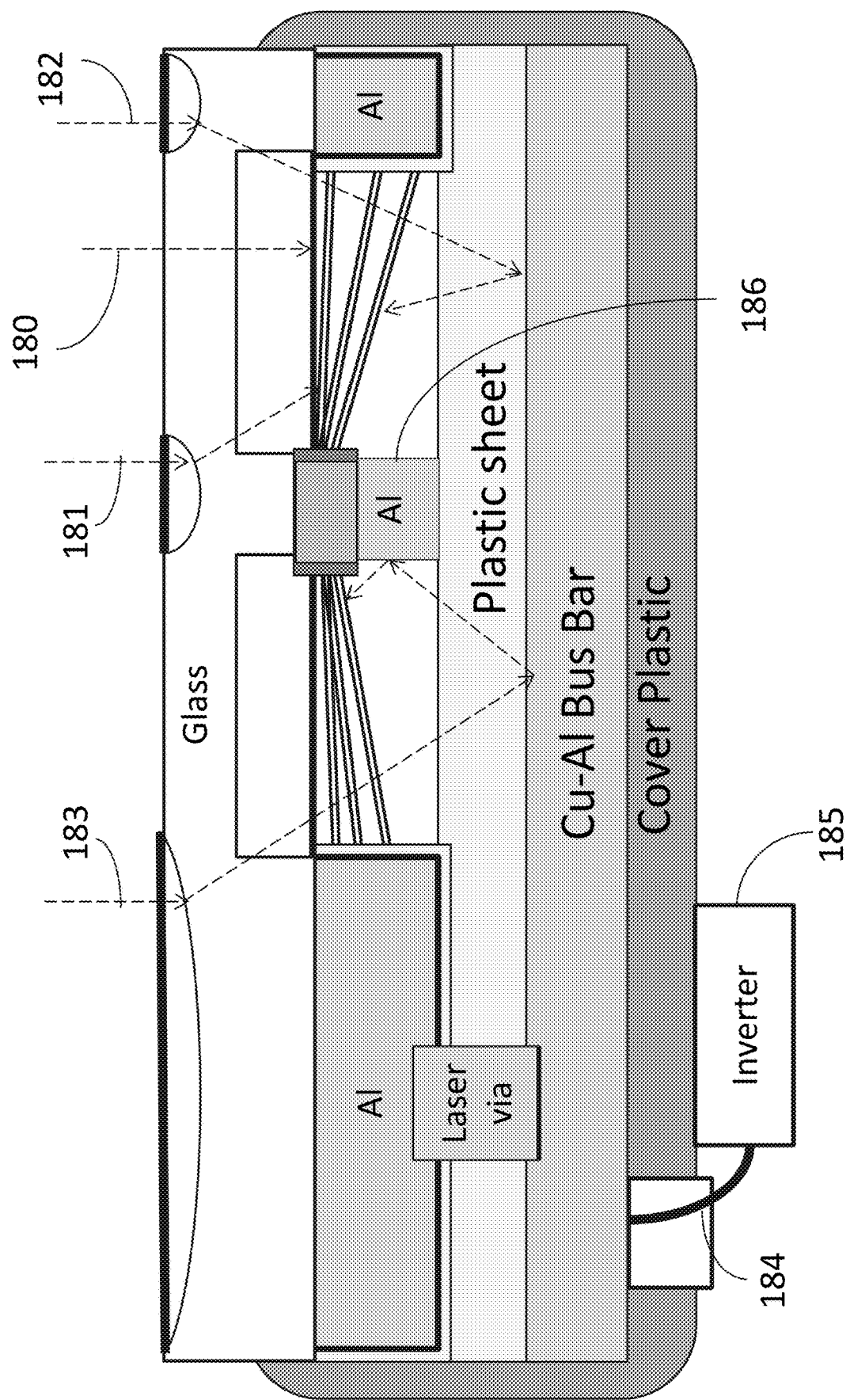

Reference is now made to FIG. 17 and FIG. 18, cross-sections of an antenna array during the final steps of manufacturing according to an aspect of the present disclosure. Following scribing of the vias, a blade may be used to spread a film of copper-aluminum paste 170 across plastic sheet 171 separated into power and ground bus bars by the resist 160 shown in FIG. 16. The blade-spreading may also fill the vias 172, thereby connecting the bus bars 170 to the bus lines 173 underneath the plastic sheet 171. Finally, cover plastic 174 may be sprayed on and dried to seal the solar cell. The solar cell may be turned over for normal operation as shown in FIG. 18. The glass may be designed to block UV but transmit both visible and IR light 180 to maximize the absorption by the nanotube antennas. The etched indents may divert the light toward the nanotube antennas 181. The bus bars may be composed of a highly reflective material to reflect back to the nanotube antennas any light not initially absorbed 182, which may then be absorbed by the nanotube antennas. Furthermore, the aluminum fingers 186 may be tall enough to also reflect unabsorbed light back to the nanotube antennas. Wires 184 and inverters 185, to connect individual cells into larger panels, may be attached on the back of the solar cell.

Figure 19:
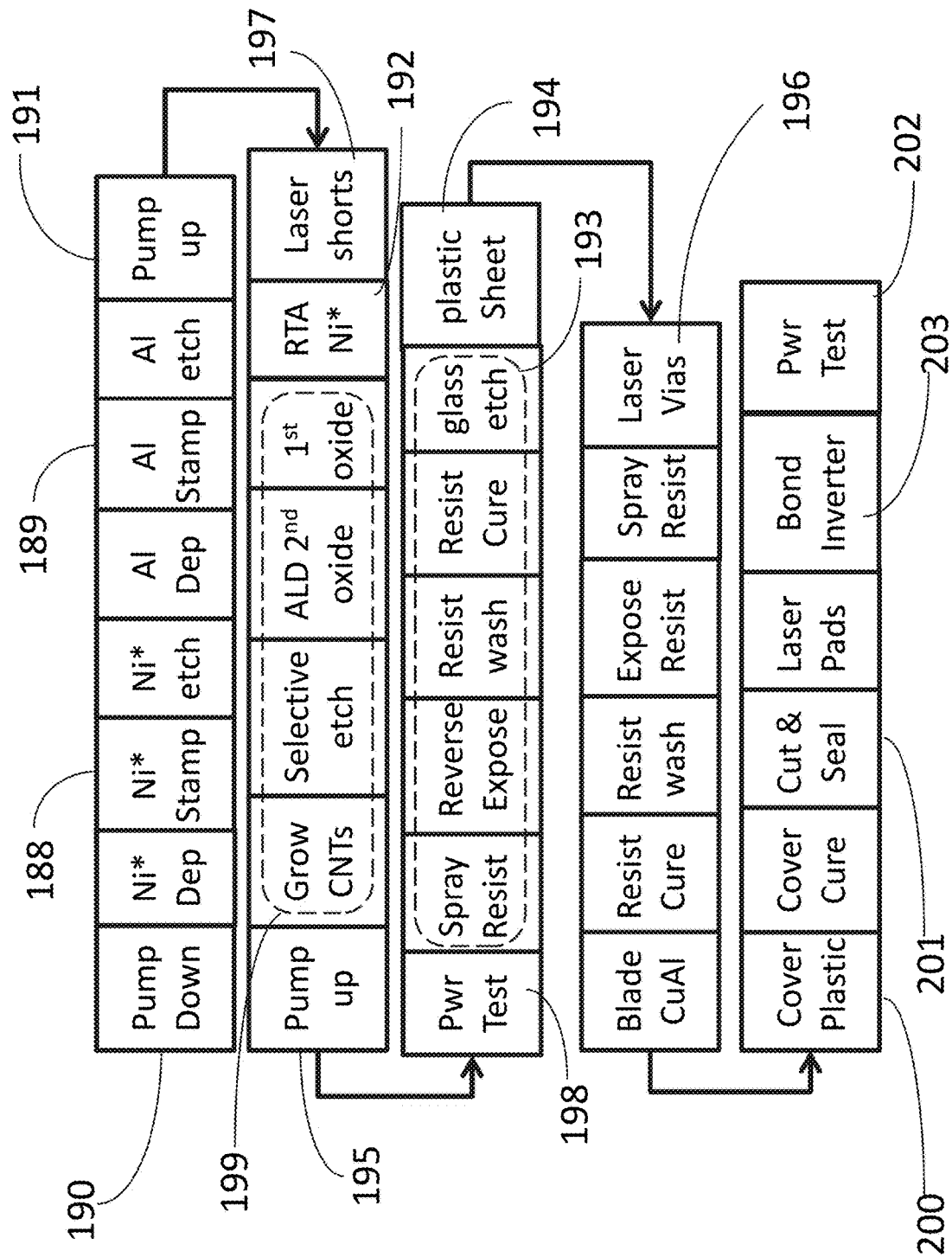
FIG. 19 is a diagram of continuous flow process steps according to an aspect of the present disclosure.

Reference is now made to FIG. 19, a diagram of continuous flow process steps according to one or more embodiments of the invention. The process may begin with a roll of thin glass and may end either with a roll of finished panels, or a stack of individually cut panels. NiO or Ni alloy stamping 188 may be done continuously with a rotating drum press. The drum may be coated with silicon nitride or some other material to minimize any sticking of the oxide/alloy to the drum. Alternatively a thin layer of nickel may be created by oxide reduction to the nickel oxide or an isotropic etch to the nickel alloy to promote the stamping of the material. Light may be measured through the nickel stripes and/or reflected off the deposited aluminum to align the subsequent aluminum stamping 189. Similarly, a silicon carbide coating may be added to the aluminum stamp to minimize any metal sticking to the drum.

Figure 20:
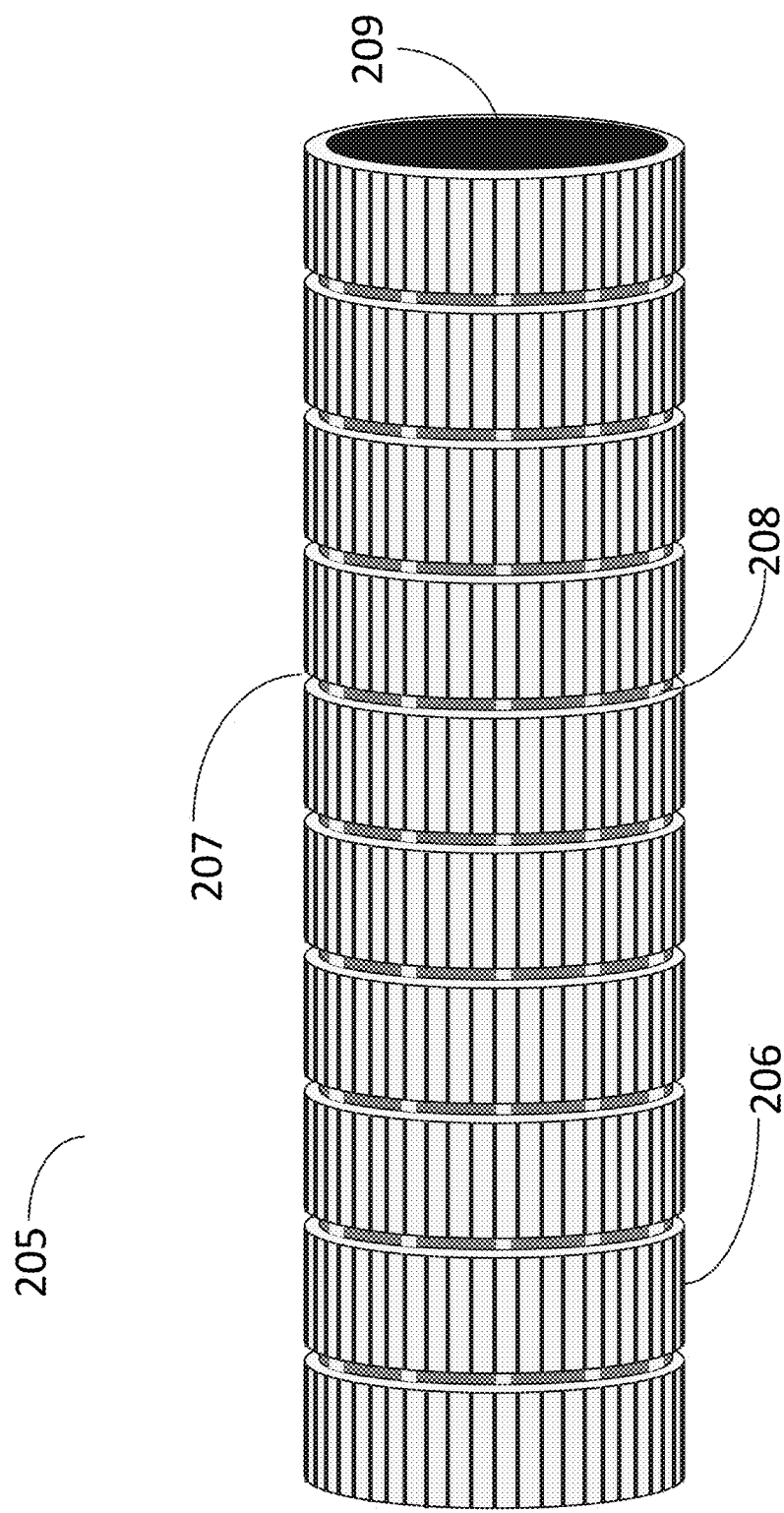
FIG. 20 is a diagram of a diagram of an aluminum stamp drum.

Reference is now made to FIG. 20, a diagram of an aluminum stamp drum. The aluminum drum 205 may include multiple small cylinders 206, where the space between the cylinders 207 may form the intermediate vertical bus lines 166,167 shown in FIG. 16. Furthermore, the space between the cylinders 207 may vary in width using piezoelectric spacers 208, which may thereby allow each cylinder to be individually aligned to the previously etched nickel oxide traces. The cylinders may be hollow 209 to allow electrical connections to the piezoelectric spacers. In this manner the roll to roll equipment may be easily widened by adding more cylinders to accommodate the increasing width of the glass rolls.

Reference is again made to FIG. 19. To minimize cost, all the high-vacuum metal deposition steps may be done within a single vacuum chamber between pump down 190 and a partial pump up 191 to a low-torr pressure chamber, which thereafter may be maintained to perform the laser shorts cutting, nickel reduction/anneal and the antenna-diode process steps 199, followed by a pump up 195 to normal atmosphere. The laser shorts 197 cutting may be done by IR measurement while applying a voltage across adjacent power and ground lines. The cuts may be performed in a manner shown in FIG. 6. The anneal may be performed with a rapid temperature anneal (RTA) process, and may include hydrogen or ammonia for reduction of the oxide to form the nickel layer. For fabricating the MIIC diodes, the steps 199 may consist of two oxide growth steps, a selective oxide etch and the carbon nanotube growth. The steps 193 to create the glass lenses may enhance the efficiency of the solar cells and may be considered optional. They may be added after bringing the rest of the system up. The plastic film may be attached 194 to the aluminum fingers using an adhesive, which may also enhance the laser etching of the vias 196. For large runs of standard sized panels, the Cut & Seal 201 may occur before the Cover Plastic 200, saving an additional seal operation. The power test 202 may be used to grade the resulting solar cell sheets, and tune the inverter bonded to each solar cell sheet 203.

Figure 21:
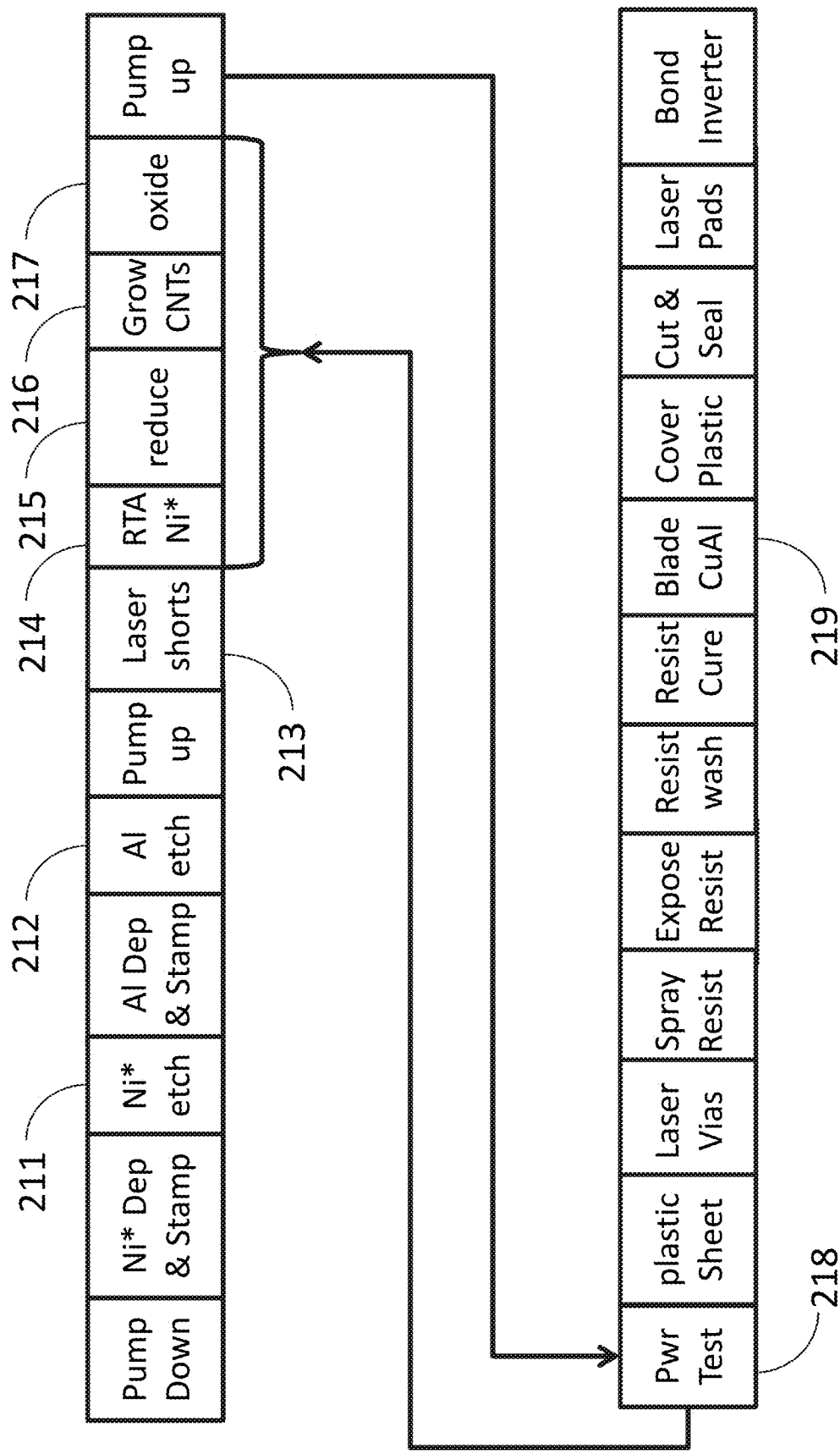
FIG. 21 is a diagram of continuous flow process steps with feedback according to another aspect of the present disclosure.

Reference is now made to FIG. 21, another diagram of continuous flow process steps with feedback according to another aspect of the present disclosure. To fabricate the geometric diodes the steps 199 in FIG. 19 may be replaced with just the carbon nanotube growth 216 followed by an oxide step 217. It may be necessary to continuously test the results of each process step to adequately control the continuous flow process steps shown in FIG. 21. The NiO etch step 211 and the aluminum etch step 212 may be controlled by a combination of resistance measurement between the fingers and light detected through the glass base and the fingers.

The directed carbon nanotube growth 216 may be controlled by the current detected during the application of the bias voltage between the fingers. Furthermore, the bias voltage may be adjusted based on the level of this current. The rate of current increase during the growth phase may be an indicator of the level of growth. It may be desirable to maintain moderate growth to maximize the antenna density while minimizing the antenna entanglement. The level of oxide reduction may correlate to the subsequent level of carbon nanotube growth. Therefore, the level of growth detected by the rate of current increase may be used to control the upstream oxide reduction step 215. Following the pump up to full atmosphere, power tests 218 may be performed. Results of these electrical and power measurements may be used to further control the earlier process steps 214 through 217. The oxide step 217 may be adjusted based on the electrical profile of the diodes. Power calculations may be used to control gas flows and the temperature of the catalyst, which may be controlled by the amount of IR power applied during the carbon nanotube growth step 216. Power and sensitivity to light frequency may be measured as a small focused light source is scanned across the width of the finished antenna array roll. The variation of power measured at the test pads may be adjusted to the known defects detected and corrected in laser shorts step 213. The subsequent adjusted power across light frequencies may be compared with ideal power to adjust the Ni RTA 214 step, and the gas flows or IR power supplied during CNT growth 216 may be adjusted based on the power from specific areas across the width of the antenna array roll.

Figure 22:
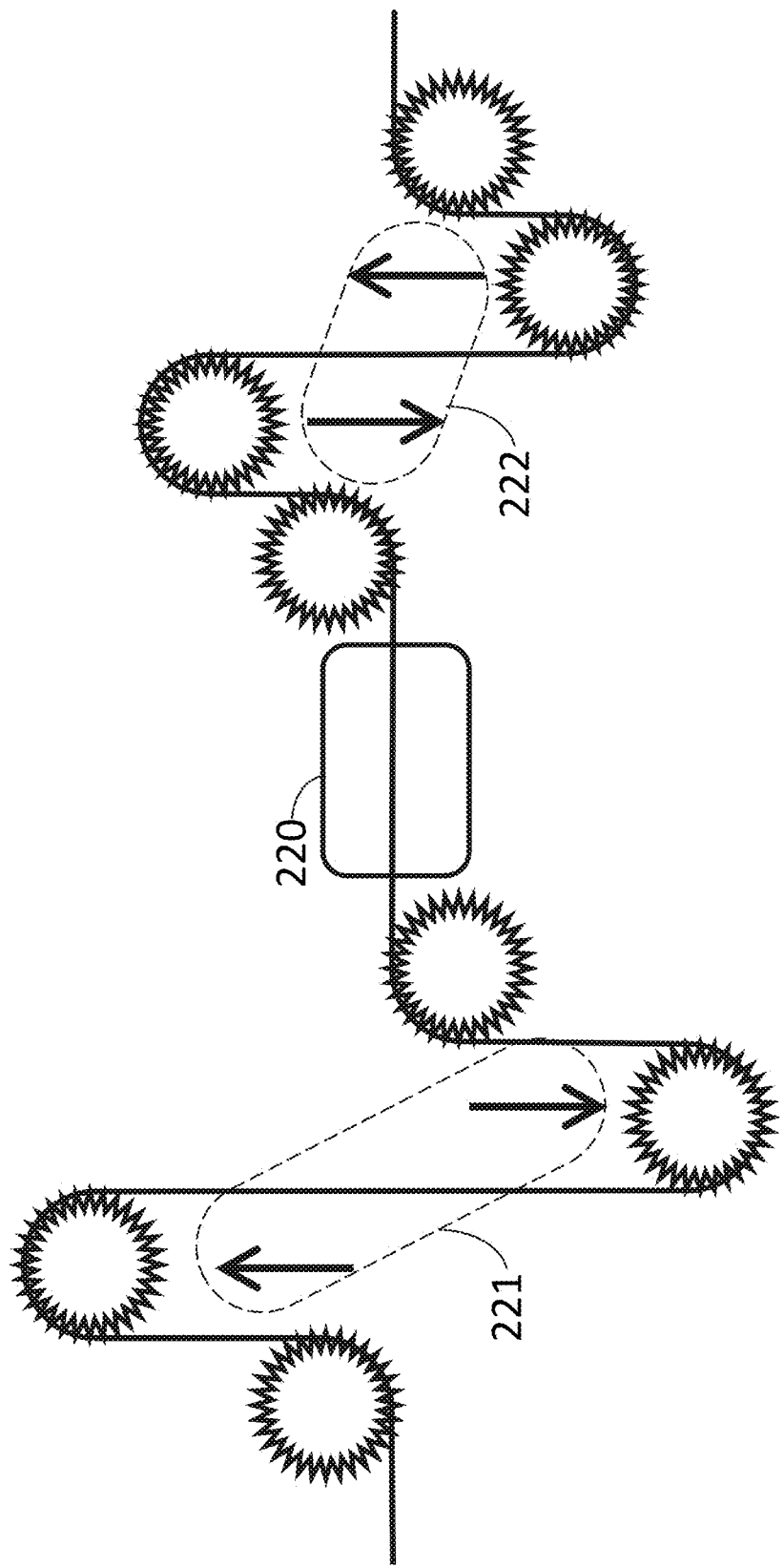
FIG. 22 is a diagram of a sprocket and reel assembly.

It is further contemplated that a sprocket and reel assembly as shown in FIG. 22, may be employed to control slack and transit times between each step 220, until the processing times may be realigned. Slack in the reels between steps may be increased 221 to slow down subsequent steps and reduced 222 to speed them up.

It is also contemplated that additional metrology steps may be inserted between any or all of the processing steps and used to further control the previous or subsequent processing steps.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

We claim:

1. A solar antenna array configured to convert sunlight into electrical energy comprising:
a glass sheet;
a plurality of parallel ground fingers under the glass sheet;

a plurality of parallel voltage fingers under the glass sheet, wherein each of the ground fingers is parallel to an adjacent voltage finger;
a clear insulating sheet under the ground fingers and the voltage fingers;
a power bus bar under the clear insulating sheet;
a ground bus bar under the clear insulating sheet;
a plurality of carbon nanotube antennas; and
a plurality of diodes;
wherein each of the ground fingers is electrically connected to the ground bus bar, and each of the voltage fingers is electrically connected to the power bus bar, and
wherein each antenna is coupled to a ground finger and, through a diode, to an adjacent voltage finger, and
wherein the glass sheet includes a plurality of lenses, wherein a respective lens is disposed directly above a respective one of the plurality of parallel power fingers or directly above a respective one of the plurality of ground fingers, and wherein the lenses are configured to divert light to the carbon nanotube antennas connected to the respective ones of the plurality of parallel power fingers and the respective ones of the plurality of parallel ground fingers above which the respective lenses are disposed.

2. The solar antenna array in claim 1, wherein one or more of the diodes are three-dimensional carbon nanotube geometric diodes.

3. The solar antenna array in claim 1, wherein one or more of the diodes are a geometric diode in series with a respective metal-oxide carbon diode.

4. The solar antenna array in claim 1, wherein one or more of the diodes are a geometric diode in series with a respective metal-insulator-insulator-carbon diode.

5. The solar antenna array in claim 1, wherein each antenna is coupled to a ground finger through a vertical layer of nickel.

6. A method of fabricating a solar antenna array comprising
a plastic cover;
power and ground bus bars;
a clear insulating sheet;
power and ground fingers; and
a glass sheet; wherein the method comprises:
a) forming the power and ground fingers on top of the glass sheet, and further forming a plurality of lenses on a bottom of the glass sheet, wherein a respective one of the lenses is formed directly below a respective one of the power and ground fingers;
b) forming the clear insulating sheet on top of the power and ground fingers;
c) forming the ground and power bus bars on top of the clear insulating sheet; and
d) forming the plastic cover on top of the ground and power bus bars.

7. The method of fabricating a solar antenna array as in claim 6, further comprising inverting a structure formed by the method according to claim 6 in order to enable operation of the structure as a solar antenna array.

8. The solar antenna array of claim 1, wherein lengths of the plurality of carbon nanotube antennas vary to receive at least one harmonic of all frequencies of sunlight.

9. The method of fabricating a solar antenna array as in claim 6, wherein forming the ground and power bus bars on top of the clear insulating sheet further comprises:
exposing resist spread on the clear insulating sheet by transmitting light through the area not connected with carbon nanotube antennas;
washing away the unexposed resist, leaving a continuous serpentine of resist;
forming vias through the clear insulating sheet; and
blade spreading a layer of copper-aluminum paste over the continuous serpentine of resist.

\* \* \* \* \*